US011283419B2

(12) United States Patent
Dragan et al.

(10) Patent No.: US 11,283,419 B2
(45) Date of Patent: Mar. 22, 2022

(54) AUTO-ZERO AMPLIFIER FOR REDUCING OUTPUT VOLTAGE DRIFT OVER TIME

(71) Applicant: SEMICONDUCTOR COMPONENTS INDUSTRIES, LLC, Phoenix, AZ (US)

(72) Inventors: Anca Mihaela Dragan, Mioveni (RO); Andrei Enache, Bucharest (RO); Alina I. Negut, Bucharest (RO); Adrian Macarie Tache, Bucharest (RO)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 191 days.

(21) Appl. No.: 16/827,842

(22) Filed: Mar. 24, 2020

(65) Prior Publication Data
US 2021/0305957 A1 Sep. 30, 2021

(51) Int. Cl.
*H03F 3/45* (2006.01)
*H03M 1/12* (2006.01)

(52) U.S. Cl.
CPC ..... *H03F 3/45475* (2013.01); *H03F 3/45977* (2013.01); *H03M 1/12* (2013.01)

(58) Field of Classification Search
CPC .................................................... H03F 3/4547
See application file for complete search history.

(56) References Cited

U.S. PATENT DOCUMENTS

| 6,396,430 | B1* | 5/2002 | Li | H03F 3/45977 |
| | | | | 327/77 |
| 7,394,309 | B1* | 7/2008 | Potanin | H03F 3/45977 |
| | | | | 327/337 |
| 2007/0222505 | A1* | 9/2007 | Larson | H03F 3/45995 |
| | | | | 330/9 |
| 2009/0108929 | A1* | 4/2009 | Yan | H04N 5/378 |
| | | | | 330/9 |
| 2010/0289568 | A1 | 11/2010 | Eschauzier et al. | |
| 2013/0127526 | A1 | 5/2013 | Sayuk | |
| 2013/0134988 | A1 | 5/2013 | Pulijala | |
| 2013/0241637 | A1 | 9/2013 | Ivanov et al. | |
| 2015/0270805 | A1 | 9/2015 | Maurino et al. | |
| 2016/0336948 | A1 | 11/2016 | Chern | |
| 2017/0111018 | A1* | 4/2017 | Horiuchi | H03F 3/45744 |

* cited by examiner

*Primary Examiner* — Patricia T Nguyen
(74) *Attorney, Agent, or Firm* — Brake Hughes Bellermann LLP

(57) ABSTRACT

According to an aspect, an auto-zero amplifier includes a main amplifier, a secondary amplifier connected to the main amplifier, a plurality of switching including a first switch and a second switch, and a leakage control circuit.

20 Claims, 12 Drawing Sheets

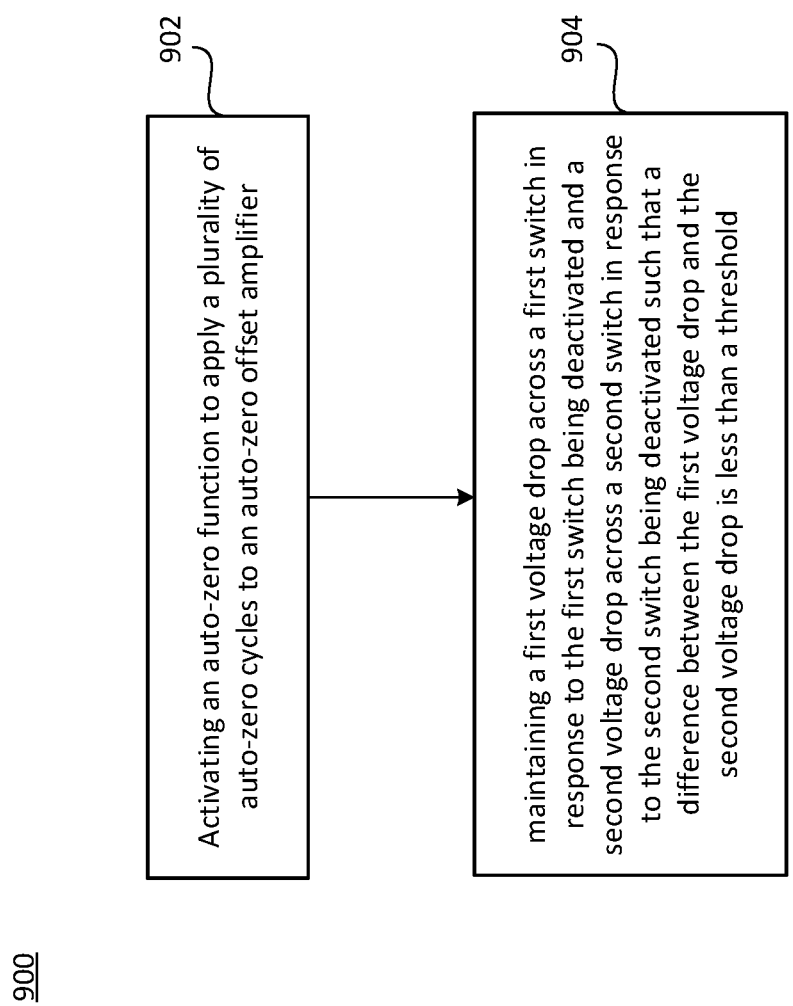

AUTO-ZERO AMPLIFIER FOR REDUCING OUTPUT VOLTAGE DRIFT OVER TIME

BACKGROUND

When a zero voltage is applied between inputs of an operational amplifier, the output voltage is zero. However, in actual amplifiers, process variations which result in an imperfect matching of components within the operational amplifier may lead to a positive or negative output voltage when the inputs are forced to zero. The magnitude of the output voltage may be proportional to the open loop gain of the operational amplifier and may be referred to as offset voltage. In order to reduce the effect of offset voltage, an amplifier may use an auto-zero technique. However, in some conventional auto-zero techniques, the output voltage may drift over time.

SUMMARY

According to an aspect, an auto-zero amplifier includes a main amplifier, a secondary amplifier connected to the main amplifier, a plurality of switching including a first switch and a second switch, and a leakage control circuit coupled between the first switch and a first input of the secondary amplifier. The leakage control circuit is coupled between the second switch and a second input of the secondary amplifier. The leakage control circuit configured to maintain a first voltage drop across the first switch in response to the first switch being deactivated and to maintain a second voltage drop across the second switch in response to the second switch being deactivated such that a difference between the first voltage drop and the second voltage drop is less than a threshold.

BRIEF DESCRIPTION OF THE DRAWINGS

FIG. 9 illustrates a flowchart depicting example operations of an auto-zero amplifier for reducing voltage drift according to an aspect.

DETAILED DESCRIPTION

Figure 1A:
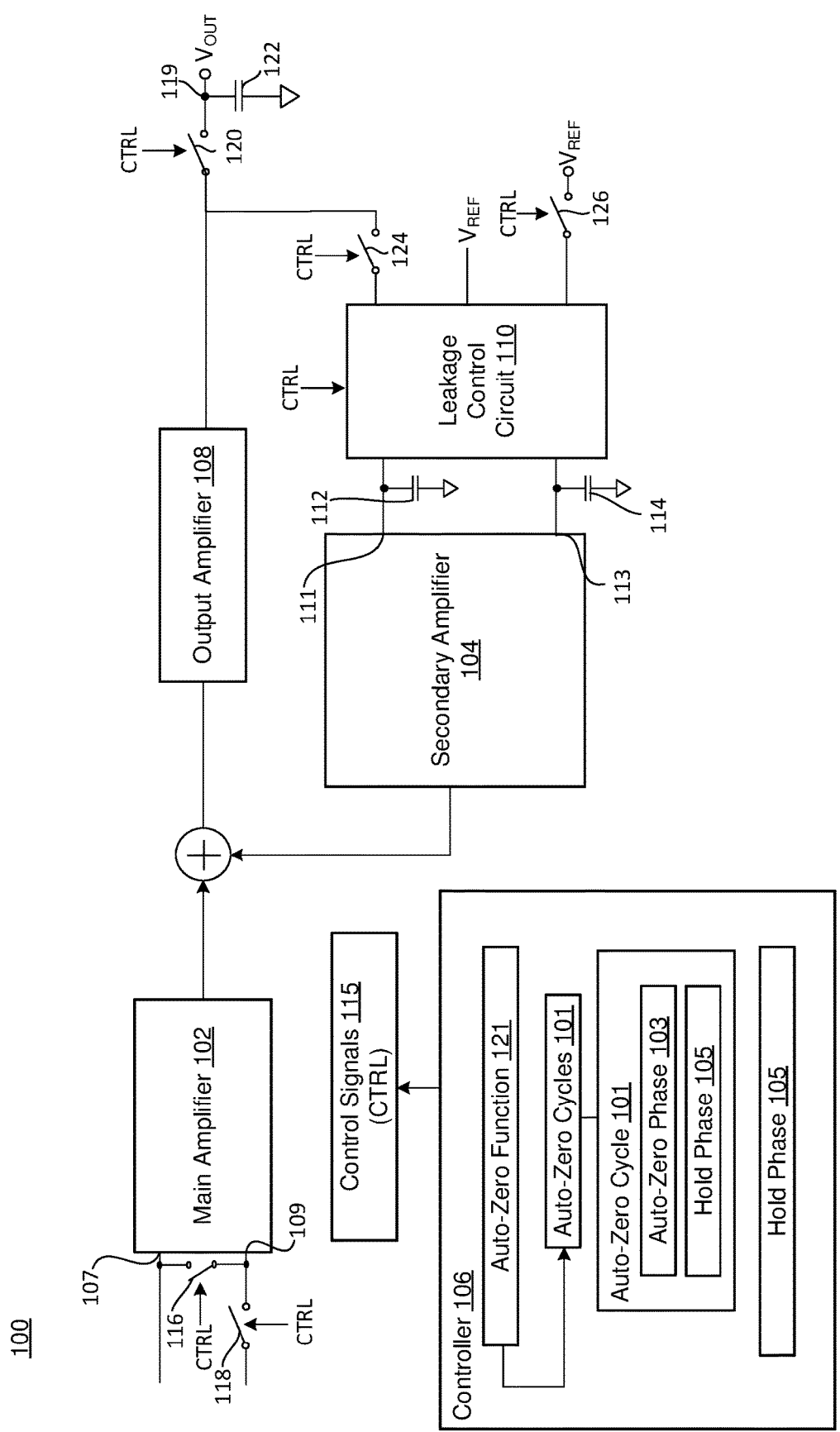
FIG. 1A illustrates an auto-zero amplifier that reduces voltage drift according to an aspect.

This disclosure provides an auto-zero amplifier that reduces voltage drift over time. The auto-zero amplifier includes a main amplifier, a secondary amplifier, an output amplifier, and a leakage control circuit. Also, the auto-zero amplifier includes a plurality of switches, where the plurality of switches enable the transition of the auto-zero amplifier between an auto-cycle phase and a hold phase. For example, the auto-zero amplifier activates an auto-zero function to operate the auto-zero amplifier according to a number of auto-zero cycles, where each auto-zero cycle includes an auto-zero phase and a hold phase. Generally, the voltage offset of the main amplifier is measured by the secondary amplifier in the auto-zero phase, and the voltage offset is subtracted from the output of the main amplifier in the hold phase. In some examples, the auto-zero amplifier is driven by a finite number of auto-zero cycles, which allows the output voltage to be substantially noiseless (or completely noiseless). In some examples, after the auto-zero amplifier is driven by a finite number of auto-zero cycles, the auto-zero function is deactivated, and the auto-zero amplifier may execute in the hold phase for a period of time.

After the auto-zero function is disabled, and if the hold phase is longer than a threshold period of time the two voltages at the inputs of the secondary amplifier may start exhibiting differences between their values, due to leakage mismatch (e.g., drain-source leakage) of a first switch and a second switch (e.g., the first and second switches may be used to transition between the auto-zero phase and the hold phase). In some examples, this mismatch may be caused by the different voltage drops across the first switch (which is connected to the output of the output amplifier on the feedback loop) and the second switch (which is connected to the reference voltage). The leakage mismatch of the first switch and the second switch may cause the voltage offset to change over time, thereby leading to a drift of the output voltage.

However, according to the embodiments discussed herein, the leakage control circuit is provided between the inputs of the secondary amplifier and the first and second switches in order to compensate for the current leakage of the first switch and the second switch. The leakage control circuit is configured to ensure (or substantially ensure) that the voltage drop across the first switch is the same as the voltage drop across the second switch, thereby reducing (or eliminating) the leakage mismatch. For example, the leakage control circuit is configured to maintain a first voltage drop across the first switch in response to the first switch being deactivated and to maintain a second voltage drop across the second switch in response to the second switch being deactivated such that a difference between the first voltage drop and the second voltage drop is less than a threshold (e.g., and/or substantially equal to each other).

In other words, the first switch may include a first drain-source off-state leakage, and the second switch may include a second drain-source off-state leakage. The leakage control circuit is configured to ensure that a difference between the first drain-source off-state leakage and the second drain-source off-state leakage is less than a threshold (and/or substantially equal to each other). As a result, the output voltage may be relatively constant over time (e.g., reduces or eliminates voltage drift).

FIG. 1A illustrates an auto-zero amplifier 100 according to an aspect. The auto-zero amplifier 100 may reduce or eliminate voltage drift over time. In some examples, in order to reduce the voltage offset, the auto-zero amplifier 100 is configured to activate an auto-zero function 121, which causes the auto-zero amplifier 100 to execute a plurality of auto-zero cycles 101. In some examples, the number of auto-zero cycles 101 may be variable but a finite number, which may depend on the application. In some examples, the number of auto-zero cycles 101 is a finite number (e.g., less than or equal to fifty, less than or equal to twenty-five, less than or equal to fifteen, etc.). In some examples, the use of a finite number of auto-zero cycles 101 may reduce or substantially eliminate the noise associated with the auto-zero amplifier 100. Each auto-zero cycle 101 includes an auto-zero phase 103 and a hold phase 105. In some examples, the auto-zero cycles 101 are considered auto-zero pulses. Generally, the voltage offset is measured in the auto-zero phase 103, and the voltage offset is removed in the hold phase 105. In some examples, after the number of auto-zero cycles 101 are applied, the auto-zero function 121 may be deactivated, and the auto-zero amplifier 100 may remain in the hold phase 105 for a period of time 139 (e.g., referring to FIG. 1B) such that the output voltage ($V_{OUT}$) remains relatively constant (e.g., voltage drift is reduced or eliminated). In some examples, the auto-zero function 121 is not disabled, and the auto-zero amplifier 100 may continuously execute the auto-zero cycles 101 while the auto-zero amplifier 100 is active.

The auto-zero amplifier 100 may receive an input voltage and generate an output voltage ($V_{OUT}$) that is relatively constant over time. The auto-zero amplifier 100 may be used in a wide range of applications. In some examples, the auto-zero amplifier 100 is used to buffer, amplify and/or measure a voltage. In some examples, the auto-zero amplifier 100 is included within an integrated sensor. In some examples, the auto-zero amplifier 100 is included within an analog-to-digital converter (ADC) circuit, where the auto-zero amplifier 100 is used to buffer or amplify the voltage provided to the converter. In some examples, the auto-zero amplifier 100 is included within a bandgap reference circuit configured to generate a relatively constant reference voltage over time. In some examples, the auto-zero amplifier 100 is included within a voltage measurement circuit that measures internal voltages on external pads.

The auto-zero amplifier 100 includes a main amplifier 102, a secondary amplifier 104, an output amplifier 108 a leakage control circuit 110, and a controller 106. Also, the auto-zero amplifier 100 includes a switch 116, a switch 118, a switch 120, a switch 124, a switch 126, a capacitor 112, a capacitor 114, and a capacitor 122. In some examples, the controller 106 is configured to activate the auto-zero function 121 to operate the auto-zero amplifier 100 according to a number of auto-zero cycles 101 in order to compensate for the effect of the voltage offset of the main amplifier 102. In some examples, the controller 106 is configured to periodically activate the auto-zero function 121. Each auto-zero cycle 101 includes an auto-zero phase 103 and a hold phase 105. In some examples, the auto-zero phase 103 may be referred to as a sampling phase. The controller 106 may generate control signals 115 to control the switch 116, the switch 118, the switch 120, the switch 124, and the switch 126 in order to place the auto-zero amplifier 100 in the auto-zero phase 103 or the hold phase 105. After multiple auto-zero cycles 101, the controller 106 is configured to deactivate the auto-zero function 121, and the auto-zero amplifier 100 is configured to operate in the hold phase 105 for a period of time 139 (e.g., which may be relatively long such as in the milliseconds or longer), which may be beneficial for some applications of auto-zero amplifiers such as ADCs or integrated sensors. During the period of time 139 of the hold phase 105, the auto-zero amplifier 100 may generate an output voltage ($V_{OUT}$) in which the voltage drift is reduced or eliminated.

Figure 1B:
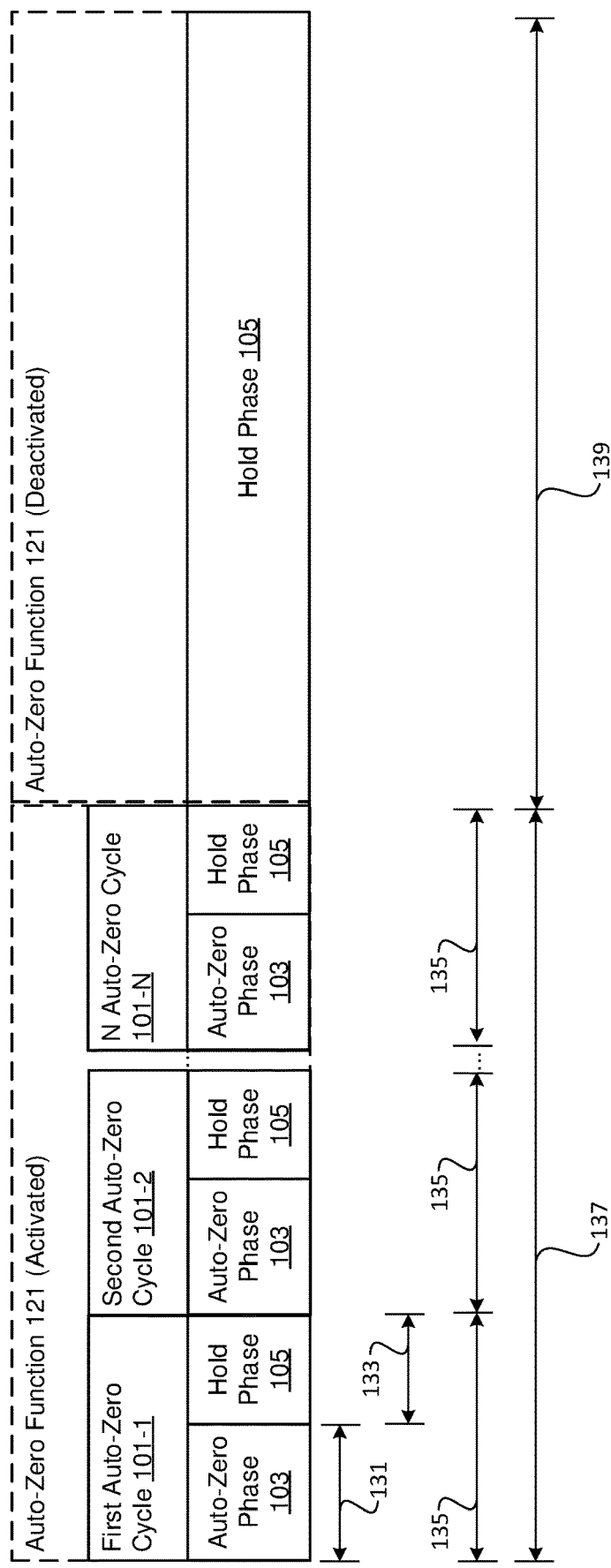
FIG. 1B illustrates an example of an activation of an auto-zero function that applies auto-zero cycles to the auto-zero amplifier and an example of a deactivation of the auto-zero function that operates the auto-zero amplifier in a hold phase according to an aspect.

FIG. 1B illustrates an example of an operation of the auto-zero amplifier 100 in response to the auto-zero function 121 being activated and in response to the auto-zero function 121 being deactivated according to an aspect. In some examples, the controller 106 is configured to periodically activate the auto-zero function 121. In some examples, the controller 106 is configured to activate the auto-zero function 121 in response to a triggering event. In some examples, the triggering event includes a calibration request (or mode) in order to reduce or eliminate the voltage offset of the main amplifier 102. The auto-zero cycles 101 are executed in response to the auto-zero function 121 being activated. The auto-zero cycles 101 are executed during a period of time 137. In some examples, the period of time 137 is in the microsecond range (e.g., 1 to 999 microseconds).

The auto-zero cycles 101 may include a first auto-zero cycle 101-1 and a second auto-zero cycle 101-2 through N auto-zero cycle 101-N. Each auto-zero cycle 101 includes an auto-zero phase 103 and a hold phase 105. For example, each of the first auto-zero cycle 101-1 and the second auto-zero cycle 101-2 through N auto-zero cycle 101-N includes an auto-zero phase 103 and a hold phase 105. For instance, in response to the activation of the auto-zero function 121, the first auto-zero cycle 101-1 is applied, which starts with the auto-zero phase 103 of the first auto-zero cycle 101-1, and at the end of the auto-zero phase 103 of the first auto-zero cycle 101-1, the hold phase 105 of the first auto-zero cycle 101-1 starts. At the end of the hold phase 105 of the first auto-zero cycle 101-1, the auto-zero phase 103 of the second auto-zero cycle 101-2 starts, and at the end of the auto-zero phase 103 of the second auto-zero cycle 101-2, the hold phase 105 of the second auto-zero cycle 101-2 start. This process continues until the end of the N auto-zero cycle 101-N.

The value of the integer N may depend on the application of the auto-zero amplifier 100. In some examples, the integer N is equal to or less than fifty. In some examples, the integer N is equal to or less than twenty five, equal to or less than fifteen, or equal to or less than ten. In some examples, the integer N has a value in the range of 10 to 60. In some examples, a relatively low number of auto-zero cycles 101 may provide a noiseless output voltage, and the number of auto-zero cycles 101 may depend on the type of application.

Each auto-zero cycle 101 has a time duration 135, which is dependent on the length of the auto-zero phase 103 and the hold phase 105 of a respective auto-zero cycle 101. In some examples, the time duration 135 of each auto-zero cycle 101 is the same. In some examples, the time duration 135 of one auto-zero cycle 101 is different than the time duration 135 of another auto-zero cycle 101. In some examples, the time duration 135 is in the microsecond range (e.g., 1 to 999 microseconds). With respect to a particular auto-zero cycle 101, the auto-zero phase 103 is associated with a period of time 131, and the hold phase 105 is associated with a period of time 133. In some examples, the combination of the period of time 131 and the period of time 133 is equal to the time duration 135. In some examples, the combination of the time duration 135 for each auto-zero cycle 101 when the auto-zero function 121 is activated is equal to the period of time 137. In some examples, a delay (or dead time) exists between each auto-zero cycle 101-1, where the period of time 137 is greater than the combination of the time durations 135 for the auto-zero cycles 101. In some examples, the period of time 131 is equal to the period of time 133. In some examples, the period of time 131 is greater than the period of time 133. In some examples, the period of time 131 is less than the period of time 133. In some examples, the period of time 131 and the period of time 133 are in the microsecond range (e.g., 1 to 999 microseconds).

After the auto-zero cycles 101 are applied, the auto-zero function 121 is deactivated, and the auto-zero amplifier 100 is configured to execute in the hold phase 105 for a period of time 139. The time duration of the hold phase 105 during the deactivation of the auto-zero function 121 (e.g., the period of time 139) is greater than the period of time 137 of when the auto-zero function 121 is activated. In some examples, the period of time 139 is greater by ten times the amount of the period of time 137. In some examples, the period of time 139 is greater by one hundred times (or one thousand times) the amount of the period of time 137. In some examples, period of time 137 is in the microsecond range (e.g., 1 to 999 microseconds), and the period of time 139 is in the millisecond range (e.g., 1 to 999 milliseconds). In some examples, the technical benefits of having a longer hold phase 105 may include a more precise output voltage (which may be due to a more noiseless output voltage to be used by the application). In some examples, after the hold phase 105 of when the auto-zero function 121 is deactivated, the controller 106 is configured to re-activate the auto-zero function 121. In some examples, the controller 106 is configured to re-activate the auto-zero function 121 in response to a triggering event.

Referring back to FIG. 1A, in order to place the auto-zero amplifier 100 in the auto-zero phase 103, the controller 106 may generate control signals 115 to close the switch 116, the switch 124, and the switch 126, and generate control signals 115 to open the switch 118 and the switch 120. A switch being closed (or in the closed position) indicates that the switch is activated where the two terminals of the switch are connected (e.g., conducting). A switch being opened (or in the open position) indicates that the switch is deactivated where the two terminals of switch are not connected (e.g., not conducting). As such, in the auto-zero phase 103, the inputs of the main amplifier 102 are shorted together (e.g., the switch 116 is closed, the switch 118 is open), and the secondary amplifier 104 and the output amplifier 108 are connected in a closed feedback loop (e.g., the switch 120 is open, the switch 124 is closed, the switch 126 is closed). In the auto-zero phase, 103, the offset voltage of the main amplifier 102 is measured by the secondary amplifier 104. For example, the difference between the input currents of the main amplifier 102 is measured as the difference between the input voltages of the secondary amplifier 104.

In some examples, after the auto-zero phase 103, the controller 106 is configured to switch the hold phase 105. In order to place the auto-zero amplifier 100 in the hold phase 105, the controller 106 may generate control signals 115 to close the switch 118 and the switch 120 and generate control signals 115 to open the switch 116, the switch 124, and the switch 126. In the hold phase 105, the feedback loop between the secondary amplifier 104 and the output amplifier 108 is open (e.g., the switch 120 is closed, the switch 124 and the switch 126 are open). Also, in the hold phase 105, the input voltage is applied to the main amplifier 102 (e.g., the switch 116 is open, the switch 118 is closed). Further, in the hold phase 105, the output of the secondary amplifier 104 (which reflects the measured voltage offset of the main amplifier 102) is combined with the output of the main amplifier 102, thereby adjusting (e.g., subtracting) the offset voltage from the output of the main amplifier 102.

As indicated above, the controller 106 is configured to activate the auto-zero function 121 to drive the auto-zero amplifier 100 according to a number of auto-zero cycles 101. The auto-zero function 121 is activated in order to reduce or eliminate the offset of the main amplifier 102. The controller 106 is configured to activate the auto-zero function to drive the auto-zero amplifier 100, which reduces or eliminates the offset of the main amplifier 102. In some examples, after the auto-zero amplifier 100 is driven by the auto-zero cycles 101 (thereby minimizing the voltage offset), the controller 106 deactivates the auto-zero function 121 and operates the auto-zero amplifier 100 in the hold phase 105 for the period of time 139, while allowing the output voltage ($V_{OUT}$) to be substantially noiseless (or completely noiseless). For example, deactivating the auto-zero function 121 after the offset is minimized allows the output voltage to be substantially noiseless (or completely noiseless).

If the duration of the period of time 139 of the hold phase 105 is relatively long (e.g., longer than a threshold period of time), the two voltages at the inputs of the secondary amplifier 104 may start exhibiting differences between their values, due to leakage mismatch (e.g., drain-source leakage) of the switch 124 and the switch 126. This mismatch may be caused by the different voltage drops across the switch 124 and the switch 126, and this mismatch of leakage currents may increase at higher temperatures. The different voltage drops cause a voltage at one of the inputs of the secondary amplifier 104 to be different from the other input of the secondary amplifier 104 (e.g., which may inaccurately measure the voltage offset). As such, this effect may cause the voltage offset to change over time, thereby leading to a drift of the output voltage ($V_{OUT}$).

However, in order to reduce (or eliminate) voltage drift during the period of time 139 of the hold phase 105 (e.g., when the auto-zero function 121 is deactivated), the leakage control circuit 110 is provided between the inputs of the secondary amplifier 104 and the switches 124, 126 in order to compensate for the current leakage of the switch 124 and the switch 126. For example, the leakage control circuit 110 is configured to maintain a first voltage drop across the switch 124 in response to the switch 124 being deactivated and to maintain a second voltage drop across the switch 126 in response to the switch 126 being deactivated such that a difference between the first voltage drop and the second voltage drop is less than a threshold. In some examples, the threshold is a variation in percentage. In some examples, the difference between the first voltage drop and the second voltage drop is around one percent or less than one percent. In some examples, the threshold is 0.1% or less than 0.1%. In some examples, the leakage control circuit 110 is configured to maintain that the second voltage drop is the same (or substantially the same) as the first voltage drop. In other words, the leakage control circuit 110 is configured to ensure (or substantially ensure) that the voltage drop across the switch 124 is the same (or substantially the same) as the voltage drop across the switch 126, thereby reducing (or eliminating) the leakage mismatch.

In other words, the leakage control circuit 110 is configured to match the leakage current through the switch 124 and the switch 126 such that the voltage drop across the switch 124 and the switch 126 is the same (or substantially the same). In some examples, the leakage control circuit 110 is configured to match (e.g., substantially match) the drain-source off-state leakage of the switches 124, 126. For example, the switch 124 may include a first drain-source off-state leakage, and the switch 126 may include a second drain-source off-state leakage. The leakage control circuit 110 is configured to ensure that a difference between the first drain-source off-state leakage and the second drain-source off-state leakage is less than a threshold. In some examples, the threshold is a variation in percentage. In some examples, the variation is around or less than one percent. In some examples, the various is around or less than 0.1%. In some examples, the leakage control circuit 110 is configured to ensure that the second drain-source off-state leakage is substantially the same as the first drain-source off-state leakage. As a result, the output voltage ($V_{OUT}$) may be relatively constant over time (e.g., reduces or eliminates voltage drift).

The main amplifier 102 includes a first input 107 configured to receive an input voltage and a second input 109 configured to receive an input voltage. In some examples, the first input 107 is a non-inverted input. In some examples, the second input 109 is an inverted input. The main amplifier 102 is configured to generate an output current based on the difference of the voltage applied to the first input 107 and the voltage applied to the second input 109. In some examples, the main amplifier 102 includes an operational amplifier. The main amplifier 102 is connected to an input of the output amplifier 108. Also, the output of the main amplifier 102 is connected to the output of the secondary amplifier 104. The switch 116 is connected between the first input 107 of the main amplifier 102 and the second input 109 of the main amplifier 102. The switch 116 is configured to selectively short circuit the first and second inputs 107, 109 of the main amplifier 102 in response to a control signal 115 from the controller 106. The switch 118 is configured to selectively disconnect/connect the input voltage from/to the second input 109 in response to a control signal 115 from the controller 106.

The output amplifier 108 is configured to receive the combined output (e.g. the combined current output) of the main amplifier 102 and the secondary amplifier 104. The output amplifier 108 may be an operational amplifier. The output amplifier 108 is configured to generate a voltage based on the combined output of the main amplifier 102 and the secondary amplifier 104. In some examples, the output amplifier 108 is configured to generate the output voltage ($V_{OUT}$).

The switch 120 includes a first terminal connected to the output of the output amplifier 108 and a second terminal connected to a node 119. The switch 120 is configured to assist in creating an open feedback loop between the output amplifier 108 and the secondary amplifier 104 in response to the switch 120 being in the closed position. The switch 120 is configured to assist in creating a closed feedback loop between the output amplifier 108 and the secondary amplifier 104 in response to the switch 120 being in the open position. The voltage on the node 119 may be the output voltage. The capacitor 122 includes a first terminal connected to the node 119 and a second terminal connected to ground.

The secondary amplifier 104 is selectively coupled to the output of the output amplifier 108. The secondary amplifier 104 may be referred to as a nulling amplifier. The secondary amplifier 104 is coupled to the input of the output amplifier 108. The secondary amplifier 104 includes a first input 111 and a second input 113. In some examples, the first input 111 is a non-inverted input. In some examples, the second input 113 is an inverted input. The capacitor 112 includes a first terminal connected to the first input 111 and a second terminal connected to ground. The capacitor 114 includes a first terminal connected to the second input 113 and a second terminal connected to ground. The capacitor 112 and the capacitor 114 may be considered hold capacitor that hold the charge of the voltage applied at the first input 111 and the second input 113 during the hold phase 105. Also, the first input 111 of the secondary amplifier 104 is connected to the output of the output amplifier 108 (via the leakage control circuit 110 and the switch 124). The second input 113 of the secondary amplifier 104 is configured to receive the reference voltage ($V_{REF}$) (via the leakage control circuit 110 and the switch 126).

The leakage control circuit 110 includes one or more electrical components configured to match the leakage current through the switch 124 and the switch 126 such that the voltage drop across the switch 124 and the switch 126 is the same (or substantially the same), thereby providing the same voltage on the first input 111 and the second input 113. As a result, the output voltage ($V_{OUT}$) may be relatively constant over time (e.g., reduces or eliminates voltage drift). In some examples, the electrical components may be controllable by one or more control signals 115 generated by the controller 106. In some examples, the leakage control circuit 110 is configured to receive the reference voltage ($V_{REF}$) (which is the same reference voltage selectively provided to the second input 113 of the secondary amplifier 104). In some examples, the reference voltage is used by the leakage control circuit 110 to provide a common reference mode for ensuring that the voltage drop is substantially the same across the switch 124 and the switch 126.

The leakage control circuit 110 includes a plurality of switches. In some examples, the plurality of switches are arranged in a symmetrical structure. In some examples, the plurality of switches include a first switch that is configured to be opened in response to the switch 124 being opened (and closed in response to the switch 124 being closed) and a second switch that is configured to be opened in response to the switch 126 being opened (and closed in response to the switch 126 being closed). In some examples, the leakage control circuit 110 includes a third switch and a fourth switch to provide a path to the reference voltage ($V_{REF}$) in order to maintain the same voltage drop across the switch 124 and the switch 126 (in response to the switch 124 and the switch 126 being in the open position). In some examples, the third switch and the fourth switch are connected in series in which the reference voltage ($V_{REF}$) is provided between the third switch and the fourth switch.

Figure 2A:
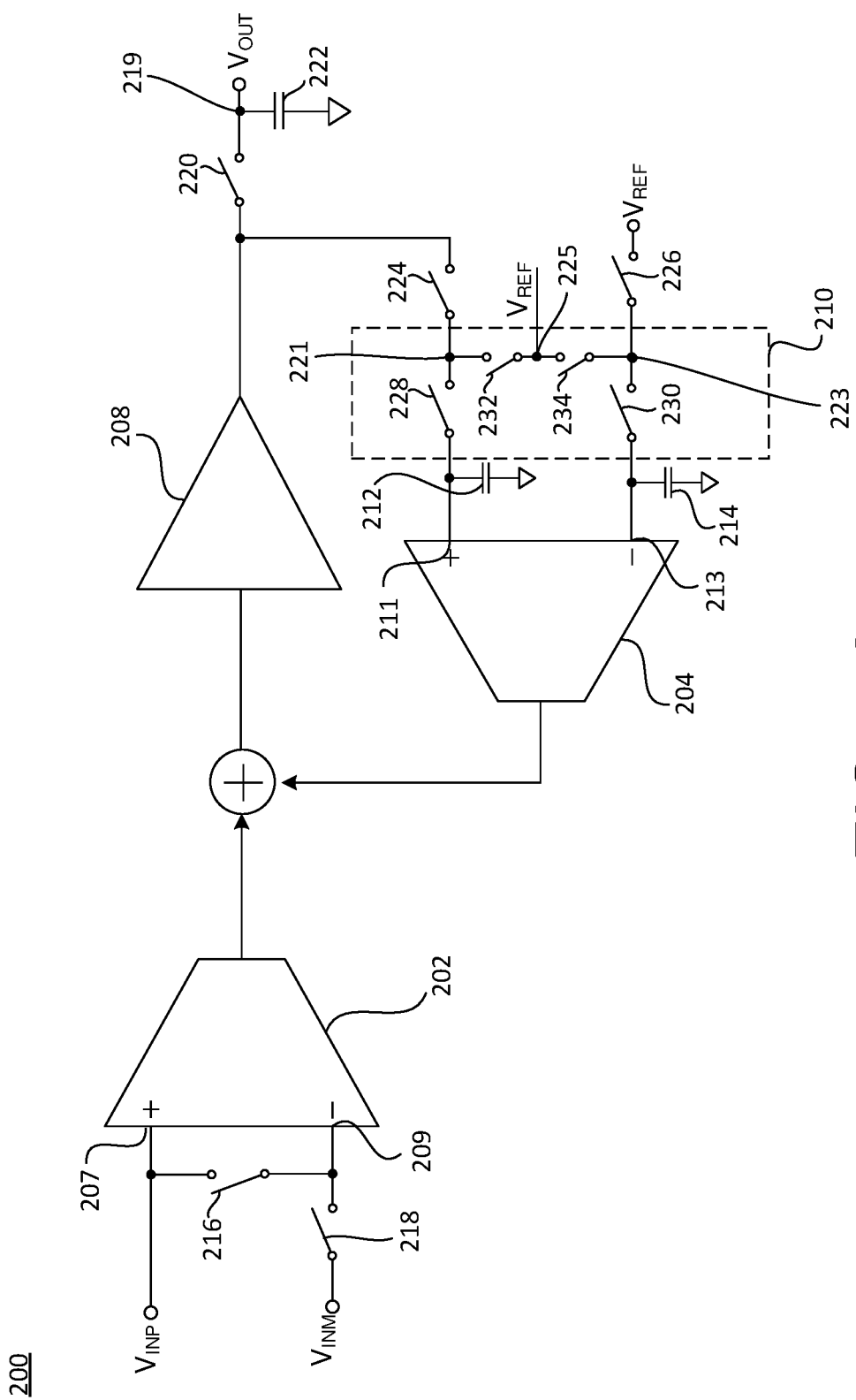
FIG. 2A illustrates an auto-zero amplifier according to an aspect.
Figure 2B:
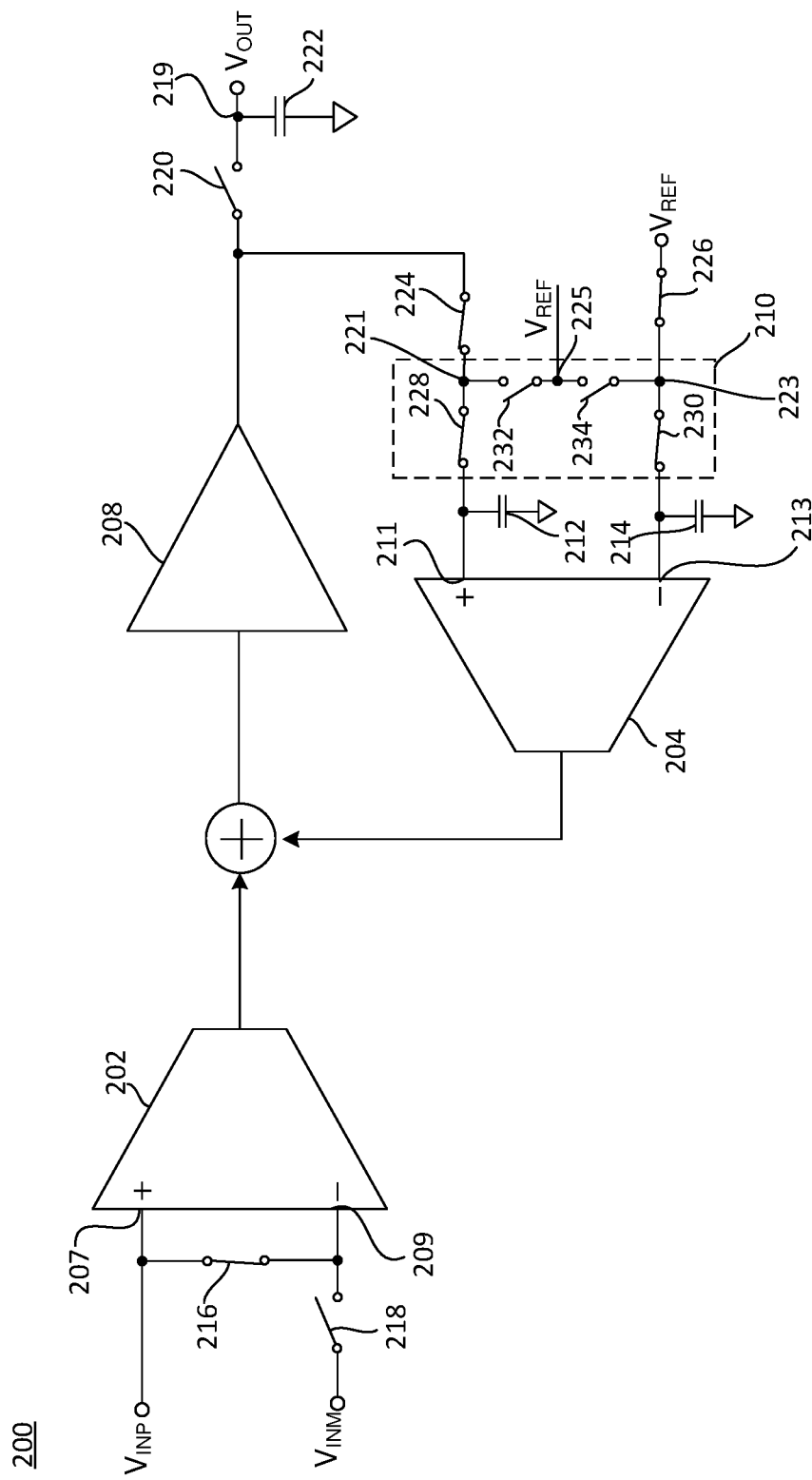
FIG. 2B illustrates an example of the auto-zero amplifier in an auto-zero phase according to an aspect.
Figure 2C:
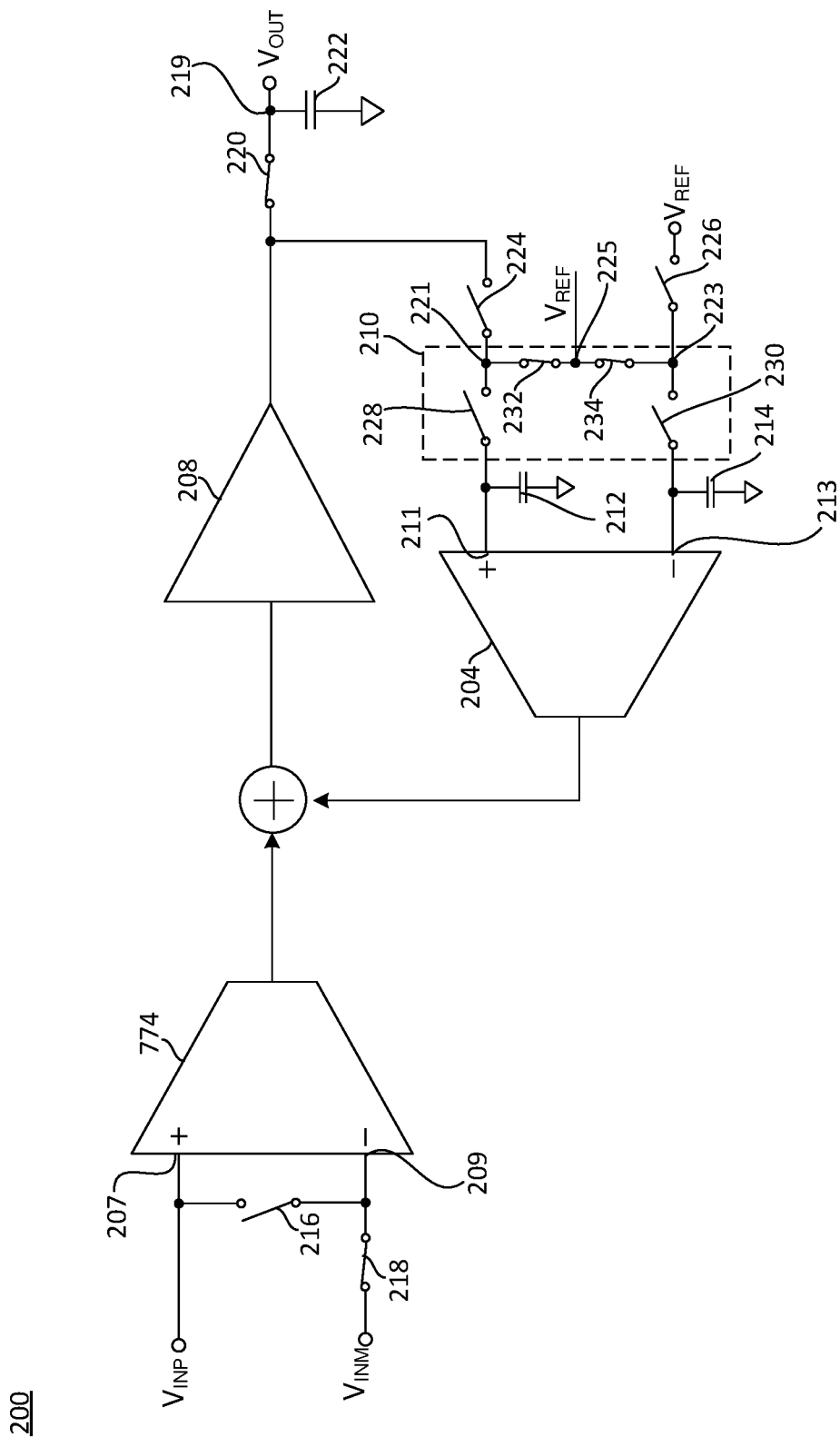
FIG. 2C illustrates an example of the auto-zero amplifier in a hold phase according to an aspect.

FIGS. 2A through 2C illustrate an auto-zero amplifier 200 according to an aspect. FIG. 2A illustrates a configuration of the auto-zero amplifier 200. FIG. 2B illustrates a configuration of the auto-zero amplifier 200 in the auto-zero phase. FIG. 2C illustrates a configuration of the auto-zero amplifier 200 in the hold phase. The auto-zero amplifier 200 may reduce or eliminate voltage drift over time. The auto-zero amplifier 200 may be an example of the auto-zero amplifier 100 of FIG. 1 and may include any of the details discussed herein.

The auto-zero amplifier 200 may receive input voltages ($V_{INP}$, $V_{INM}$) and generate an output voltage ($V_{OUT}$) that is relatively constant over time. The auto-zero amplifier 200 includes a main amplifier 202, a secondary amplifier 204, an output amplifier 208, and a leakage control circuit 210. Also, the auto-zero amplifier 200 may include a switch 216, a switch 218, a switch 220, a switch 224, a switch 226, a capacitor 222, a capacitor 212, and a capacitor 214. Further, the auto-zero amplifier 200 may include a controller (e.g., the controller 106 of FIG. 1) configured to generate control signals to control the activation/deactivation of the switches to place the auto-zero amplifier in the auto-zero phase or the hold phase and/or activate or deactivate the auto-zero function.

The auto-zero amplifier 200 is configured to operate according to a number of auto-zero cycles, where each auto-zero cycle includes an auto-zero phase and a hold phase. Generally, the voltage offset of the main amplifier 202 is measured by the secondary amplifier 204 in the auto-zero phase, and the voltage offset is subtracted from the output of the main amplifier 202 in the hold phase. In some examples, the auto-zero amplifier 200 is configured to be driven by a finite number of auto-zero cycles, which allows the output voltage ($V_{OUT}$) to be substantially noiseless (or completely noiseless). In some examples, after the auto-zero amplifier 200 is driven by a finite number of auto-zero cycles, the auto-zero function is deactivated, and the auto-zero amplifier 200 may execute in the hold phase for a period of time.

After the auto-zero function is disabled, and if the hold phase is longer than a threshold period of time, the two voltages at the inputs of the secondary amplifier 204 may start exhibiting differences between their values, due to leakage mismatch (e.g., drain-source leakage) of the switch 224 and the switch 226. In some examples, this mismatch may be caused by the different voltage drops across the switch 224 (which is connected to the output of the output amplifier 208) and the switch 226 (which is connected to the reference voltage ($V_{REF}$)). In some examples, the leakage mismatch may increase at higher temperatures. The leakage mismatch of the switch 224 and the switch 226 may cause the voltage offset to change over time, thereby leading to a drift of the output voltage.

However, according to the embodiments discussed herein, the leakage control circuit 210 is provided between the inputs of the secondary amplifier 204 and the switches 224, 226 in order to compensate for the current leakage of the switch 224 and the switch 226. The leakage control circuit 210 is configured to ensure (or substantially ensure) that the voltage drop across the switch 224 is the same as the voltage drop across the switch 226, thereby reducing (or eliminating) the leakage mismatch. For example, the leakage control circuit 210 is configured to maintain a first voltage drop across the switch 224 in response to the switch 224 being deactivated and to maintain a second voltage drop across the switch 226 in response to the switch 226 being deactivated such that a difference between the first voltage drop and the second voltage drop is less than a threshold. In some examples, the threshold is a variation in percentage. In some examples, the difference between the first voltage drop and the second voltage drop is around one percent or less than one percent. In some examples, the threshold is 0.1% or less than 0.1%. In some examples, the leakage control circuit 210 is configured to ensure that the second voltage drop is substantially the same as the first voltage drop. In some examples, the leakage control circuit 210 is configured to maintain that the second voltage drop is the same as the first voltage drop.

In other words, the leakage control circuit 210 is configured to match the leakage current through the switch 224 and the switch 226 such that the voltage drop across the switch 224 and the switch 226 is the same (or substantially the same). In some examples, the leakage control circuit 210 is configured to match (e.g., substantially match) the drain-source off-state leakage of the switches 224, 226. For example, the switch 224 may include a first drain-source off-state leakage, and the switch 226 may include a second drain-source off-state leakage. The leakage control circuit 210 is configured to ensure that a difference between the first drain-source off-state leakage and the second drain-source off-state leakage is less than a threshold. In some examples, the threshold is a variation in percentage. In some examples, the variation is around or less than one percentage. In some examples, the various is around or less than 0.1%. In some examples, the leakage control circuit 210 is configured to ensure that the second drain-source off-state leakage is substantially the same as the first drain-source off-state leakage. As a result, the output voltage ($V_{OUT}$) may be relatively constant over time (e.g., reduces or eliminates voltage drift).

In addition, in contrast to some conventional approaches that use an infinite number of auto-zero cycles, the auto-zero amplifier 200 is driven by a finite number of auto-zero cycles, which allows the output voltage ($V_{OUT}$) to be substantially noiseless (or completely noiseless). In some examples, the finite number of auto-zero cycles is less than or equal to fifty. In some examples, the finite number of auto-cycles is less than or equal to twenty-five. In some examples, the finite number of auto-cycles is less than or equal to fifteen. In some examples, a relatively low number of auto-zero cycles may provide a noiseless output voltage, and the number of auto-zero cycles may depend on the type of application. In some examples, after the auto-zero amplifier 200 is driven by a finite number of auto-zero cycle, the auto-zero amplifier 200 may execute in the hold phase for a relatively longer duration, which may be beneficial for some applications of auto-zero amplifiers such as analog-to-digital converters (ADCs).

In the auto-zero phase, the inputs of the main amplifier 202 are shorted together, and the secondary amplifier 204 and the output amplifier 208 are connected in a closed feedback loop. The difference between the input currents of the main amplifier 202 is measured as the difference between the input voltages of the secondary amplifier 204. In the hold phase, this difference results in the adjustment of the offset voltage. For example, in the hold phase, the feedback loop between the secondary amplifier 204 and the output amplifier 208 is open, but the difference between the output currents of the secondary amplifier 204 are maintained due to the capacitors 212, 214 and the leakage control circuit 210. The details of the auto-zero phase are further explained later with reference to FIG. 2B, and the details of the hold phase are further explained later with reference to FIG. 2C.

The main amplifier 202 includes a non-inverted input 207 configured to receive a voltage ($V_{INP}$) and an inverted input 209 configured to receive a voltage ($V_{INM}$). The main amplifier 202 is configured to generate an output current based the voltage difference applied to the non-inverted input 207 and the inverted input 209. In some examples, the main amplifier 202 includes an operational amplifier. The main amplifier 202 is connected to an input of the output amplifier 208. Also, the output of the main amplifier 202 is connected to the output of the secondary amplifier 204.

The switch 216 is connected between the non-inverted input 207 of the main amplifier 202 and the inverted input 209 of the main amplifier 202. For example, the switch 216 has a first terminal connected to the non-inverted input 207 (to receive the voltage ($V_{INP}$)) and a second terminal connected to the inverted input 209 (to receive the voltage ($V_{INM}$)). The switch 216 is configured to selectively short circuit the inputs of the main amplifier 202. For example, in response to the switch 216 being in a closed position (or activated position) (e.g., two terminals of the switch 216 being connected together), the inputs of the main amplifier 202 are short-circuited, which is used in the auto-zero phase in order to measure the input offset of the main amplifier 202. The switch 218 may be connected in series with the switch 216. The switch 218 has a first terminal configured to receive the voltage ($V_{INM}$) and a second terminal connected to the inverted input 209 of the main amplifier 202.

The output amplifier 208 is configured to receive the combined output (e.g. the combined current outputs) of the main amplifier 202 and the secondary amplifier 204. The output amplifier 208 is configured to generate a voltage based on the combined output of the main amplifier 202 and the secondary amplifier 204. In some examples, the output amplifier 208 is configured to generate the output voltage ($V_{OUT}$). The auto-zero amplifier 200 includes a switch 220 and a capacitor 222. The switch 220 includes a first terminal connected to the output of the output amplifier 208 and a second terminal connected to a node 219. The switch 220 is configured to assist in creating a closed feedback loop between the output amplifier 208 and the secondary amplifier 204 in response to the switch 220 being in the open position (or deactivated position) (e.g., the two terminals of the switch 220 not be electrically connected). The switch 220 is configured to assist in creating an open feedback loop between the output amplifier 208 and the secondary amplifier 204 in response to the switch 220 being in the closed position. The voltage on the node 219 may be the output voltage. The capacitor 222 includes a first terminal connected to the node 219 and a second terminal connected to ground.

The secondary amplifier 204 is selectively coupled to the output of the output amplifier 208. The secondary amplifier 204 is coupled to the input of the output amplifier 208. The secondary amplifier 204 includes a non-inverted input 211 and an inverted input 213. The capacitor 212 is connected to the non-inverted input 211 of the secondary amplifier 204. The capacitor 212 includes a first terminal connected to the non-inverted input 211 and a second terminal connected to ground. The capacitor 214 is connected to the inverted input 213 of the secondary amplifier 204. The capacitor 214 includes a first terminal connected to the inverted input 213 and a second terminal connected to ground. Also, the non-inverted input 211 of the secondary amplifier 204 is connected to the output of the output amplifier 208 (via the leakage control circuit 210 and the switch 224). The inverted input 213 of the secondary amplifier 204 is configured to receive the reference voltage ($V_{REF}$) (via the leakage control circuit 210 and the switch 226).

The leakage control circuit 210 includes a switch 228, a switch 230, a switch 232, and a switch 234. The switch 232 and the switch 234 are connected in series. The switch 228 is disposed between the capacitor 212 and the switch 224. The switch 228 includes a first terminal connected to the non-inverted input 211 of the secondary amplifier 204, and a second terminal connected to the switch 224. The switch 230 is positioned between the capacitor 214 and the switch 226. The switch 230 includes a first terminal connected to the inverted input 213 and the switch 226. A node 221 is located between the switch 228 and the switch 224, and a node 223 is located between the switch 230 and the switch 226. The switch 232 includes a first terminal connected to the node 221 and a second terminal connected to a node 225. The node 225 is configured to receive the reference voltage ($V_{REF}$). The switch 234 includes a first terminal connected to the node 225 and a second terminal connected to the node 223.

In the auto-zero phase, referring to FIG. 2B, the inputs of the main amplifier 202 are shorted together, and the secondary amplifier 204 and the output amplifier 208 are connected in a closed feedback loop. The difference between the input currents of the main amplifier 202 is measured as the difference between the input voltages of the secondary amplifier 204. For example, the switch 216, the switch 224, the switch 226, the switch 228, and the switch 230 are closed, and the switch 218, the switch 220, the switch 232, and the switch 234 are opened.

In the hold phase, referring to FIG. 2C, this difference results in the adjustment of the offset voltage. For example, in the hold phase, the feedback loop between the secondary amplifier 204 and the output amplifier 208 is open, but the difference between the output currents of the secondary amplifier 204 are maintained due to the capacitors 212, 214 and the leakage control circuit 210. For example, in the hold phase, the switch 218, the switch 220, the switch 232, and the switch 234 are closed, and the switch 216, the switch 228, the switch 224, the switch 230, and the switch 226 are open.

Figure 3:
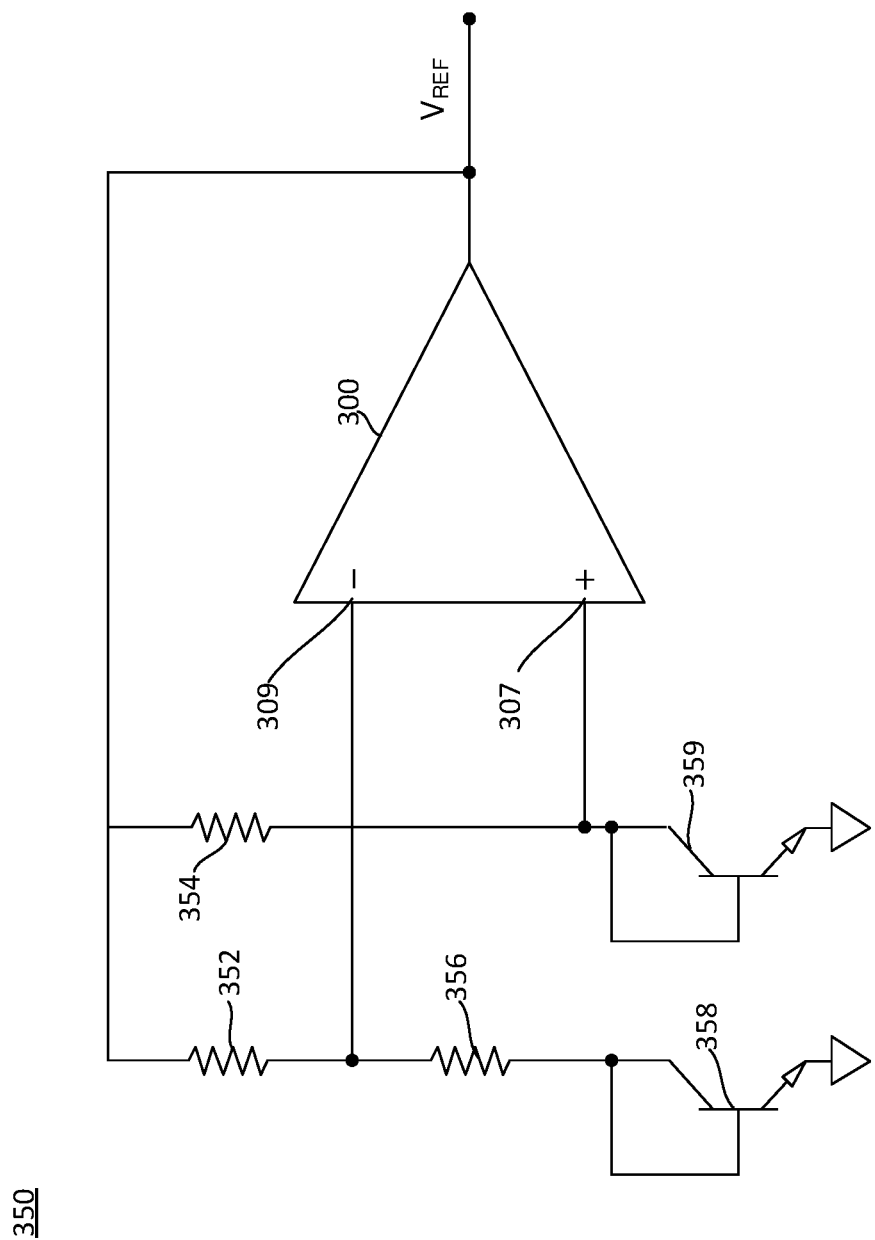
FIG. 3 illustrates a bandgap reference circuit having an auto-zero amplifier according to an aspect.

FIG. 3 illustrates a bandgap reference circuit 350 according to an aspect. The bandgap reference circuit 350 includes an auto-zero amplifier 300 according to an aspect. The bandgap reference circuit 350 may generate a relatively constant reference voltage ($V_{REF}$). The auto-zero amplifier 300 may be an example of the auto-zero amplifier 100 of FIG. 1 or the auto-zero amplifier 200 of FIGS. 2A through 2C. The bandgap reference circuit 350 includes a resistor 352, a resistor 354, a resistor 356, a transistor 358, and a transistor 359. The auto-zero amplifier 300 may include a non-inverted input 307 and an inverted input 309. The non-inverted input 307 may be an example of the non-inverted input 207 of FIG. 2A, and the inverted input 309 may be an example of the inverted input 209 of FIG. 2A. The auto-zero amplifier 300 may generate a relatively constant reference voltage ($V_{REF}$), which may be an example of the output voltage ($V_{OUT}$) of FIGS. 2A through 2C.

Figure 4:
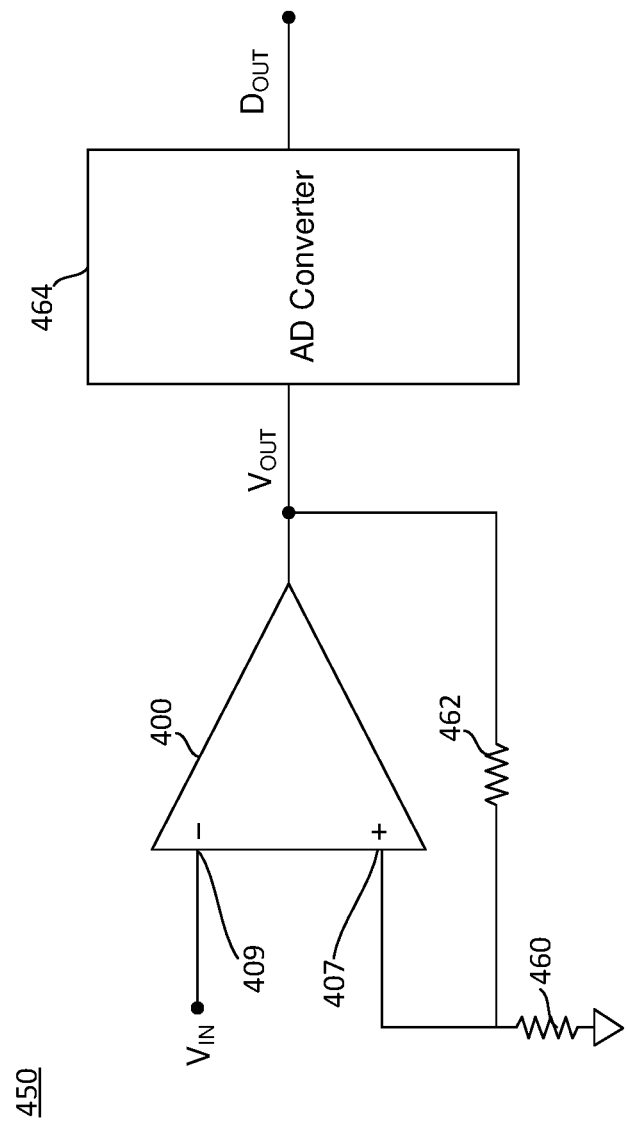
FIG. 4 illustrates an analog-to-digital converter circuit having an auto-zero amplifier according to an aspect.

FIG. 4 illustrates an analog-to-digital converter (ADC) circuit 450 according to an aspect. The ADC circuit 450 is configured to convert an analog input voltage ($V_{IN}$) to a digital output ($D_{OUT}$). The ADC circuit 450 includes an auto-zero amplifier 400 and an AD converter 464. The auto-zero amplifier 400 may be an example of the auto-zero amplifier 100 of FIG. 1 or the auto-zero amplifier 200 of FIGS. 2A through 2C. The ADC circuit 450 also includes a resistor 460 and a resistor 462. The auto-zero amplifier 400 may include a non-inverted input 407 and an inverted input 409. The non-inverted input 407 may be an example of the non-inverted input 207 of FIG. 2A, and the inverted input 409 may be an example of the inverted input 209 of FIG. 2A. The auto-zero amplifier 400 may generate a relatively constant output voltage ($V_{OUT}$), which may be an example of the output voltage ($V_{OUT}$) of FIGS. 2A through 2C.

Figure 5:
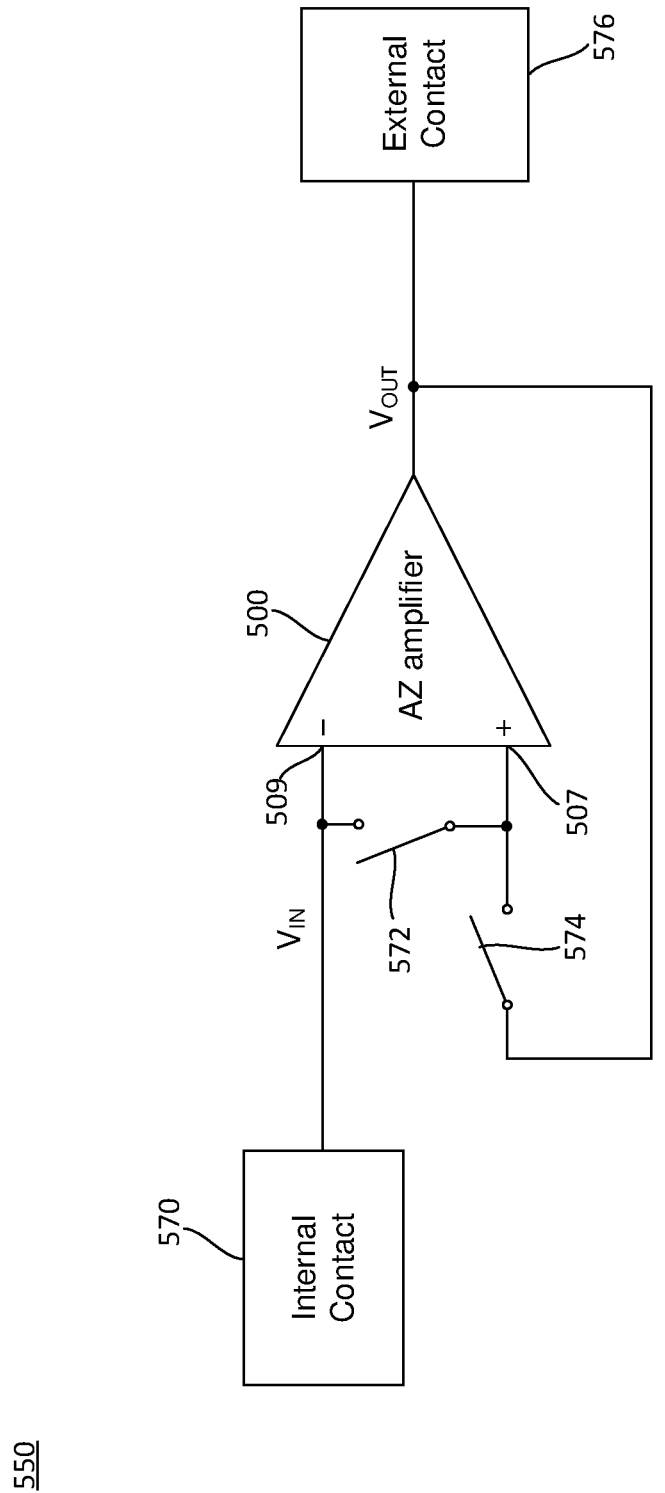
FIG. 5 illustrates a voltage measurement circuit having an auto-zero amplifier according to an aspect.

FIG. 5 illustrates a voltage measurement circuit 550 according to an aspect. In some examples, the voltage measurement circuit 550 is configured to measure an internal voltage on an external contact 576. The voltage measurement circuit 550 includes an auto-zero amplifier 500, an internal contact 570, and an external contact 576. The auto-zero amplifier 500 may be an example of the auto-zero amplifier 100 of FIG. 1 and/or the auto-zero amplifier 200 of FIGS. 2A through 2C. In some examples, the internal contact 570 includes an internal pin. In some examples, the external contact 576 includes an external pad. The auto-zero amplifier 500 may be connected between the internal contact 570 and the external contact 576.

The auto-zero amplifier 500 includes a non-inverted input 507 and an inverted input 509. The non-inverted input 507 may be an example of the non-inverted input 207 of FIG. 2A, and the inverted input 509 may be an example of the inverted input 209 of FIG. 2A. The output of the auto-zero amplifier 500 may be connected in a feedback path to the non-inverted input 507 via switch 574. Also, the internal contact 570 may be connected to the inverted input 509 of the auto-zero amplifier 500. The voltage measurement circuit 550 includes a switch 572 having a terminal connected to the non-inverted input 507 and a terminal connected to the inverted input 509.

Figure 6:
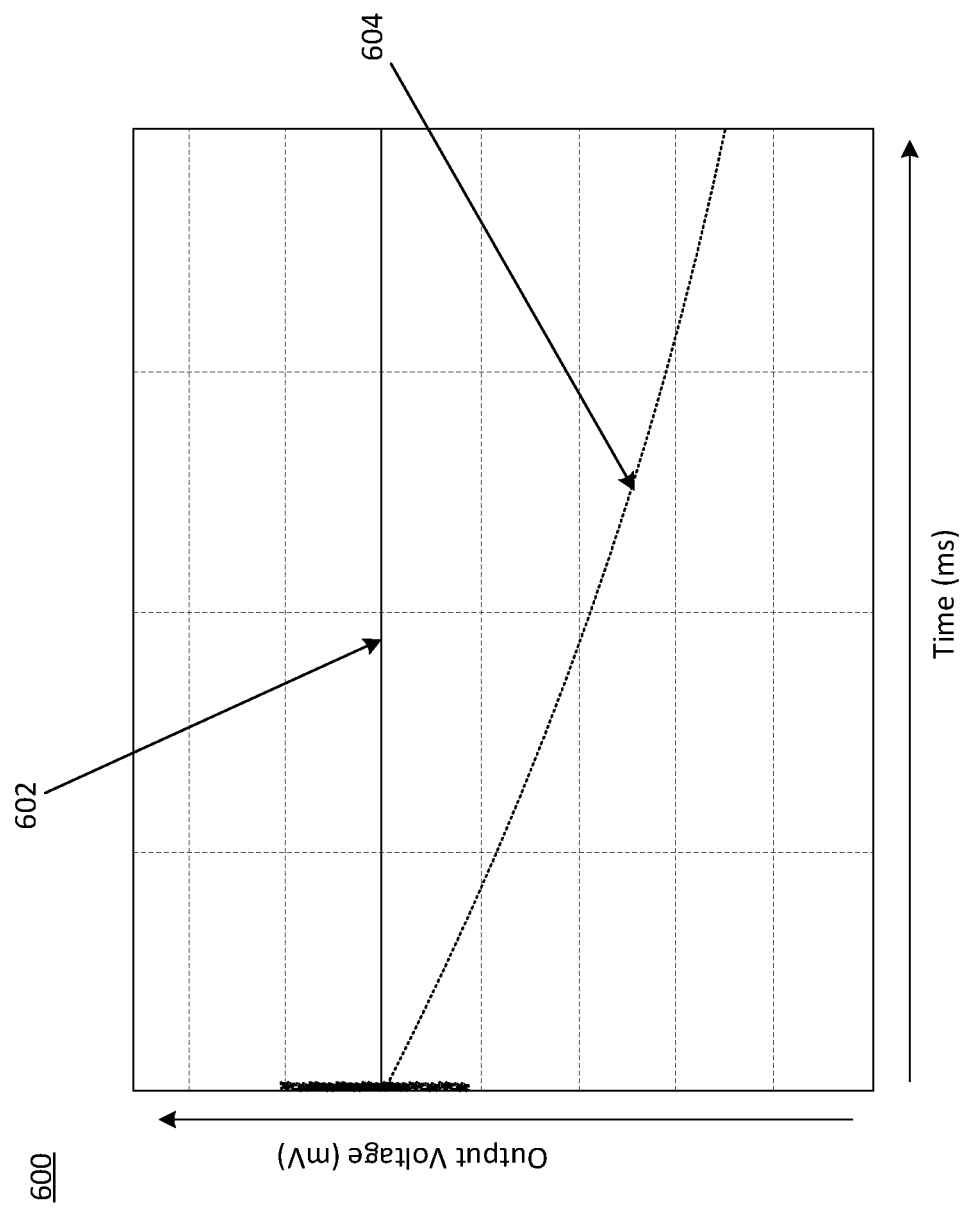
FIG. 6 illustrates a graph depicting simulation results of an amplifier according to an aspect.

FIG. 6 illustrates a graph 600 depicting simulation results of an auto-zero amplifier according to an aspect. For example, the graph 600 depicts the output voltages for a conventional auto-zero amplifier and an improved auto-zero amplifier. In this example, ten pulses of auto-zero cycles were applied to the auto-zero amplifiers, and the width of one pulse is 70 ns. The improved auto-zero amplifier may be any of the auto-zero amplifiers discussed herein. Line 602 depicts the output voltage for an improved auto-zero amplifier, and line 604 depicts the output voltage for a conventional auto-zero amplifier. As shown in FIG. 6, the conventional auto-zero amplifier's output voltage drifts over time (see line 604) whereas the improved auto-zero amplifier's output voltage remains relatively constant over time (see line 602).

Figure 7:
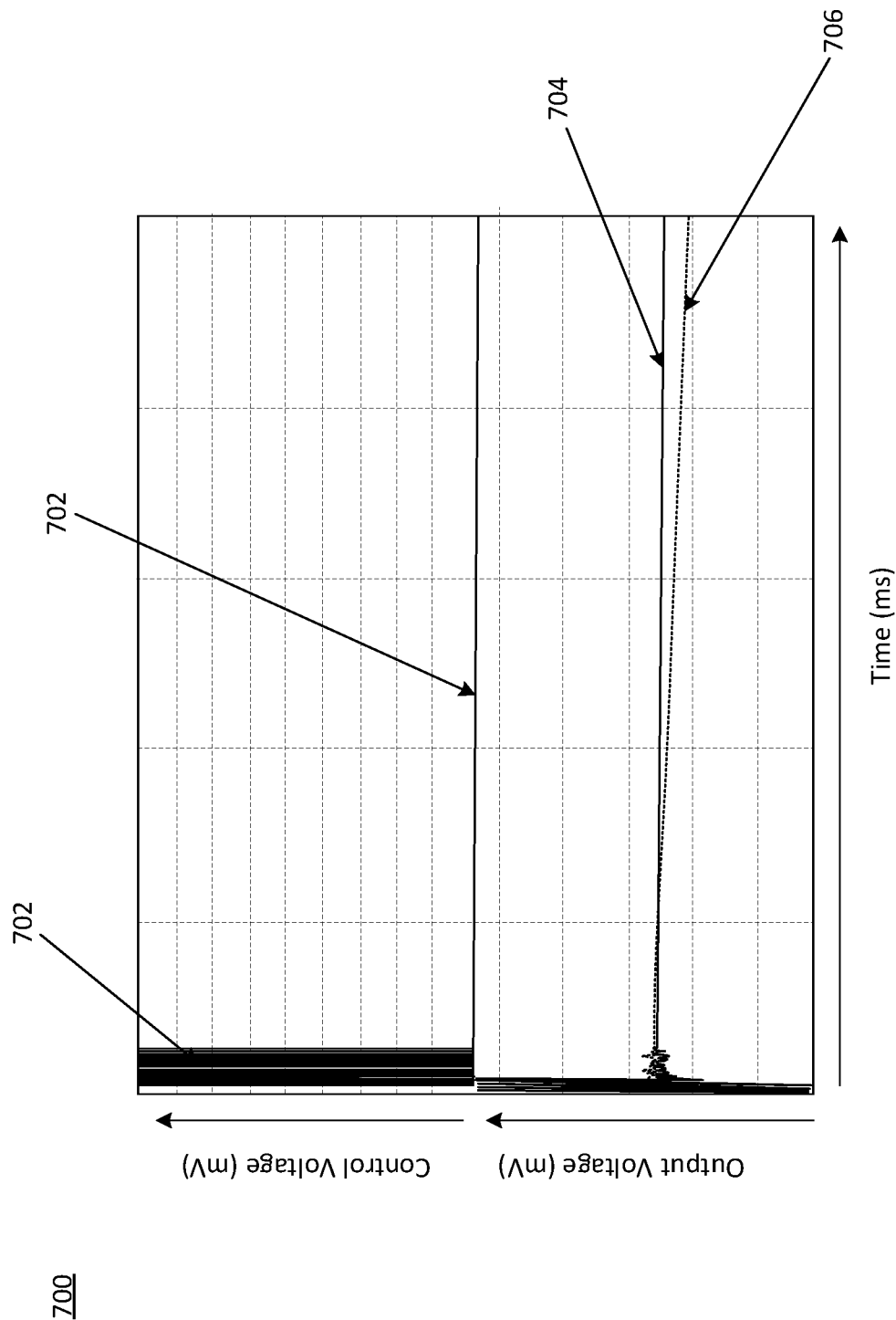
FIG. 7 illustrates a graph depicting simulation results of a bandgap reference circuit using an auto-zero amplifier according to an aspect.

FIG. 7 illustrates a graph 700 depicting simulation results of a bandgap reference circuit using an improved auto-zero amplifier according to an aspect. For example, the graph 700 depicts a control signal and output voltages for a conventional bandgap reference circuit using a standard auto-zero amplifier versus a bandgap reference circuit using the improved auto-zero amplifier. The improved auto-zero amplifier may be any of the auto-zero amplifiers discussed herein. Line 702 depicts the input voltage, where the start of the input voltage includes eight cycles of auto-zero pulses. Line 704 depicts the output voltage for the bandgap reference circuit using the improved auto-zero amplifier, and line 706 depicts the output voltage for the bandgap reference circuit using the standard auto-zero amplifier. As shown in FIG. 7, the conventional bandgap reference circuit's output voltage drifts over time (see line 706) whereas the improved bandgap reference circuit's output voltage remains relatively constant over time (see line 704).

Figure 8:
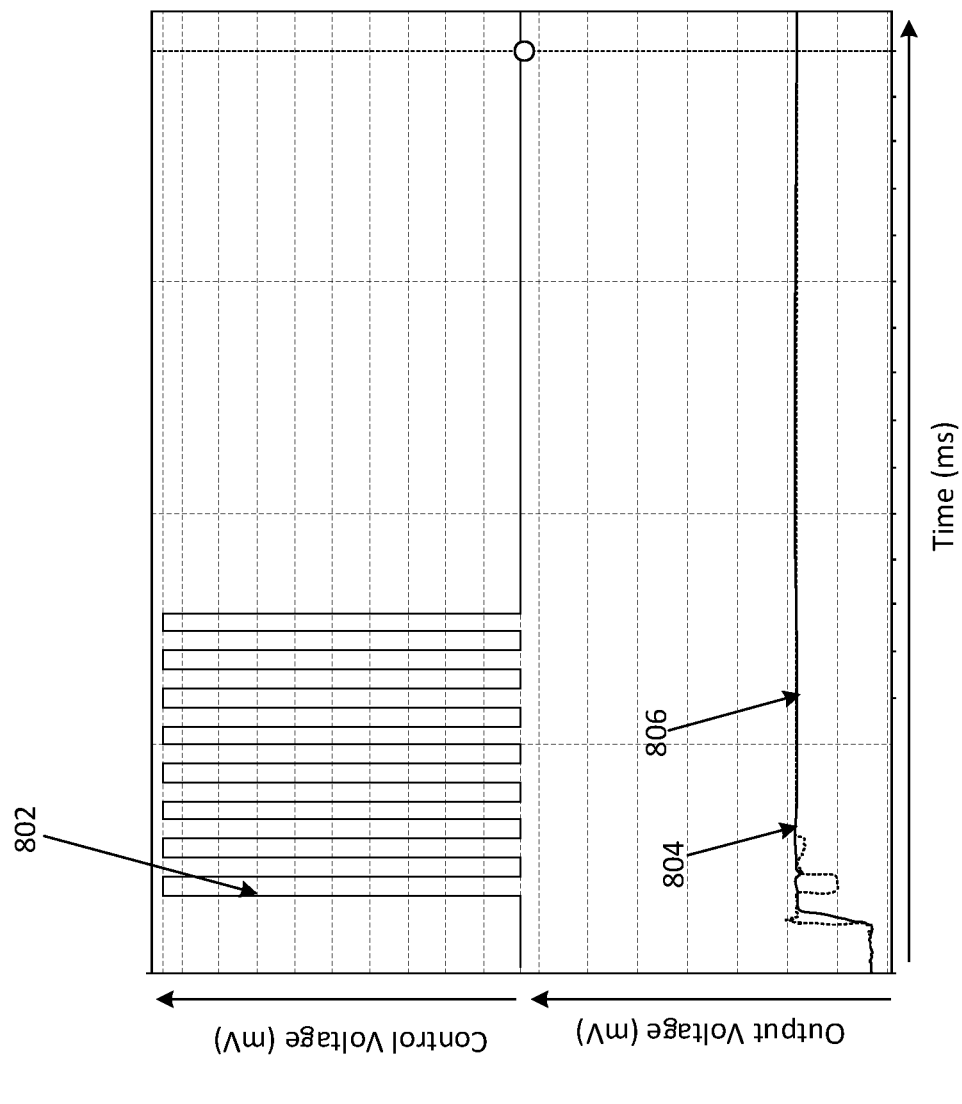
FIG. 8 illustrates a graph depicting simulation results for buffering an internal voltages using an auto-zero amplifier according to an aspect.

FIG. 8 illustrates a graph 800 depicting simulation results for buffering an internal voltages using an auto-zero amplifier according to an aspect. For example, the graph 800 depicts a transient simulation for buffering an internal voltage using the auto-zero amplifier. The auto-zero amplifier may be any of the auto-zero amplifiers discussed herein. Line 802 depicts a control signal having eight cycles. Line 804 depicts the internal voltage and line 806 depicts the external output voltage.

FIG. 9 illustrates a flowchart 900 depicting example operations of an auto-zero amplifier that reduces voltage drift over time. Although the flowchart 900 is explained with respect to the auto-zero amplifier 100 of FIGS. 1A and 1B and the auto-zero amplifier 200 of FIGS. 2A through 2C, the operations may be applicable to any of the embodiments discussed herein.

Operation 902 includes activating an auto-zero function 121 to apply a plurality of auto-zero cycles 101 to an auto-zero amplifier 100. The auto-zero amplifier 100 may include a main amplifier 102, an output amplifier 108, a secondary amplifier 104, a switch 124, a switch 126, and a leakage control circuit 110. The leakage control circuit 110 may include at least two switches (e.g., the switch 228 of FIG. 2A) and a second switch (e.g., the switch 230 of FIG. 2A). In some examples, the leakage control circuit 110 may include another switch (e.g., the switch 232 of FIG. 2A) and another switch (e.g., the switch 230 of FIG. 2A). At least one of the plurality of auto-zero cycles 101 includes an auto-zero phase 103 and a hold phase 105.

Operation 904 includes maintaining a first voltage drop across the switch 124 in response to the switch 124 being deactivated and a second voltage drop across the switch 126 in response to the switch 126 being deactivated such that a difference between the first voltage drop and the second voltage drop is less than a threshold. The maintaining step may include deactivating (e.g., opening) two switches of the leakage control circuit 110 (e.g., the switch 228 of FIG. 2A, the switch 230 of FIG. 2A) (e.g., as shown in FIG. 2C), and applying a reference voltage to the activated switches of the leakage control circuit 110. For example, in the leakage control circuit 210, the reference voltage ($V_{REF}$) is applied to the node 225. Due to the fact that in the hold phase, the switch 232 and the switch 234 are closed (activated), the node 221 and the node 223 has the potential of the reference voltage. Therefore, the reference voltage is applied to the activated switches (e.g., 232/234) of the leakage control circuit 210. For instance, a reference voltage ($V_{REF}$) may be applied to the node 225 located between the switch 232 and the switch 234. During the hold phase 105, the switch 232 and the switch 234 are activated (e.g., closed) which applies the reference voltage ($V_{REF}$) as a common reference mode to the activated switches 232, 234. In some examples, the operations further include deactivating the auto-zero function 121 to operate the auto-zero amplifier 100 in the hold phase 105 for a period of time 139, where the period of time 139 of the hold phase 105 when the auto-zero function 121 is deactivated is longer than a period of time 137 when the auto-zero function 121 is activated. In some examples, the operations include measuring, by the secondary amplifier 104, a voltage offset of the main amplifier 102 in the auto-zero phase 103, and subtracting the voltage offset from an output of the main amplifier 102 in the hold phase 105.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. Any portion of the apparatus and/or methods described herein may be combined in any combination. The embodiments described herein can include various combinations and/or sub-combinations of the functions, components, and/or features of the different embodiments described.

What is claimed is:

1. An auto-zero amplifier comprising:
   a main amplifier;
   a secondary amplifier connected to the main amplifier;
   a plurality of switches including a first switch and a second switch; and
   a leakage control circuit coupled between the first switch and a first input of the secondary amplifier, the leakage control circuit being coupled between the second switch and a second input of the secondary amplifier, the leakage control circuit configured to maintain a first voltage drop across the first switch in response to the first switch being deactivated and to maintain a second voltage drop across the second switch in response to the second switch being deactivated such that a difference between the first voltage drop and the second voltage drop is less than a threshold.

2. The auto-zero amplifier of claim 1, wherein the first voltage drop is substantially the same as the second voltage drop.

3. The auto-zero amplifier of claim 1, wherein the leakage control circuit includes a third switch and a fourth switch, the third switch being connected between the first switch of the plurality of switches and the first input of the secondary amplifier, the fourth switch being connected between the second switch of the plurality of switches and the second input of the secondary amplifier.

4. The auto-zero amplifier of claim 3, wherein the leakage control circuit includes a fifth switch and a sixth switch, the fifth and sixth switches being connected in series between the first input of the secondary amplifier and the second input of the secondary amplifier.

5. The auto-zero amplifier of claim 1, wherein the leakage control circuit is configured to receive a reference voltage.

6. The auto-zero amplifier of claim 1, further comprising:
an output amplifier configured to receive an output of the main amplifier and an output of the secondary amplifier,
wherein the first switch has a first terminal connected to an output of the output amplifier and a second terminal connected to the first input of the secondary amplifier, the second switch having a first terminal connected to a reference voltage and a second terminal connected to the second input of the secondary amplifier.

7. The auto-zero amplifier of claim 1, further comprising:
a controller configured to execute the auto-zero amplifier according to a plurality of auto-phase cycles during activation of an auto-cycle function, at least one of the plurality of auto-phase cycles including an auto-zero phase in which a voltage offset of the main amplifier is measured by the secondary amplifier and a hold phase in which an output of the main amplifier is adjusted by the measured voltage offset.

8. The auto-zero amplifier of claim 7, wherein the controller is configured to deactivate the auto-cycle function and operate the auto-zero amplifier in the hold phase for a period of time.

9. The auto-zero amplifier of claim 1, further comprising:
a first capacitor connected to the first input of the secondary amplifier; and
a second capacitor connected to the second input of the secondary amplifier.

10. An auto-zero amplifier comprising:
a main amplifier;
a secondary amplifier connected to the main amplifier;
an output amplifier configured to receive an output of the main amplifier and an output of the secondary amplifier;
a plurality of switches including a first switch and a second switch;
a controller configured to control the plurality of switches to execute the auto-zero amplifier according to a plurality of auto-phase cycles during activation of an auto-cycle function, at least one auto-phase cycle including an auto-zero phase and a hold phase, the controller configured to deactivate the auto-phase function and operate the auto-zero amplifier in the hold phase for a period of time; and
a leakage control circuit configured to maintain a first voltage drop across the first switch in response to the first switch being deactivated and to maintain a second voltage drop across the second switch in response to the second switch being deactivated such that a difference between the first voltage drop and the second voltage drop is less than a threshold.

11. The auto-zero amplifier of claim 10, wherein the auto-zero phase is a period of time in which a voltage offset of the main amplifier is measured by the secondary amplifier, wherein the hold phase is a period of time in which an output of the main amplifier is adjusted by the measured voltage offset.

12. The auto-zero amplifier of claim 10, wherein the first switch includes a first drain-source off-state leakage, and the second switch includes a second drain-source off-state leakage, the leakage control circuit configured to ensure that a difference between the first drain-source off-state leakage and the second drain-source off-state leakage is less than a threshold.

13. The auto-zero amplifier of claim 12, wherein the leakage control circuit includes a third switch disposed between a first input of the secondary amplifier and the first switch of the plurality of switches, and a fourth switch disposed between a second input of the secondary amplifier and the second switch of the plurality of switches.

14. The auto-zero amplifier of claim 13, wherein the leakage control circuit includes a fifth switch and a sixth switch, the fifth and sixth switches being connected in series between a first node and a second node, the first node being disposed between the fifth switch and the first switch of the plurality of switches, the second node being disposed between the sixth switch and the second switch of the plurality of switches.

15. The auto-zero amplifier of claim 10, wherein a number of the plurality of auto-zero cycles is equal to or less than ten, wherein the period of time of the hold phase after the deactivation of the auto-zero function is greater than one millisecond.

16. The auto-zero amplifier of claim 10, further comprising:
a first capacitor connected to a first input of the secondary amplifier; and
a second capacitor connected to a second input of the secondary amplifier.

17. A method for operating a zero-voltage offset amplifier to reduce voltage drift over time, the method comprising:
activating an auto-zero function to apply a plurality of auto-zero cycles to an auto-zero amplifier, the auto-zero amplifier including a main amplifier, a secondary amplifier, a first switch, a second switch, and a leakage control circuit, at least one of the plurality of auto-zero cycles including an auto-zero phase and a hold phase; and
maintaining, by the leakage control circuit, a first voltage drop across the first switch in response to the first switch being deactivated and a second voltage drop across the second switch in response to the second switch being deactivated such that a difference between the first voltage drop and the second voltage drop is less than a threshold.

18. The method of claim 17, wherein the leakage control circuit includes at least two switches, wherein the maintaining step includes:
deactivating the two switches of the leakage control circuit; and
applying a reference voltage to one or more activated switches.

19. The method of claim 17, further comprising:
deactivating the auto-zero function to operate the auto-zero amplifier in the hold phase for a period of time, wherein the period of time of the hold phase when the auto-zero function is deactivated is longer than a period of time when the auto-zero function is activated.

20. The method of claim 17, further comprising:

measuring, by the secondary amplifier, a voltage offset of the main amplifier in the auto-zero phase; and subtracting the voltage offset from an output of the main amplifier in the hold phase.

\* \* \* \* \*